United States Patent [19]

Shinjo et al.

[11] Patent Number: 5,315,282
[45] Date of Patent: May 24, 1994

[54] MAGNETORESISTANCE EFFECT ELEMENT

[75] Inventors: Teruya Shinjo, Uji; Hidefumi Yamamoto, Kobe; Toshio Takada, Kyoto, all of Japan

[73] Assignees: Ube Industries, Ltd., Ube; Kanegafuchi Chemical Industry Co., Ltd., Osaka; Nippon Steel Corporation, Ohte; TDK Corporation, Tokyo; Tosoh Corporation, Shinnanyo; Toyo Boseki Kabushiki Kaisha, Osaka; Nippon Mining Co., Ltd.; NEC Corporation, both of Tokyo; Matsushita electgric Industrial Co., Ltd., Kadoma; Seisan Kaihatsu Kagaku Kenkyusho, Kyoto, all of Japan

[21] Appl. No.: 820,866
[22] PCT Filed: May 20, 1991
[86] PCT No.: PCT/JP91/00671
 § 371 Date: Jan. 21, 1992
 § 102(e) Date: Jan. 21, 1992
[87] PCT Pub. No.: WO91/18424
 PCT Pub. Date: Nov. 28, 1991

[30] Foreign Application Priority Data

| | | |
|---|---|---|
| May 21, 1990 [JP] | Japan | 2-131602 |
| Jun. 14, 1990 [JP] | Japan | 2-155665 |
| Sep. 12, 1990 [JP] | Japan | 2-243076 |
| Sep. 14, 1990 [JP] | Japan | 2-244669 |
| Apr. 11, 1991 [JP] | Japan | 3-078824 |

[51] Int. Cl.⁵ .................................. H01L 43/08
[52] U.S. Cl. ......................... 338/32 R; 324/207.21
[58] Field of Search ...................... 338/32 H, 32 R; 324/207.21, 252

[56] References Cited

U.S. PATENT DOCUMENTS

| | | | |
|---|---|---|---|
| 3,813,692 | 5/1974 | Brock et al. | 360/113 |
| 3,814,863 | 6/1974 | O'Day et al. | 360/113 |
| 4,949,039 | 8/1990 | Grünberg | 338/32 H X |
| 5,206,590 | 4/1993 | Dieny et al. | 324/252 |
| 5,243,316 | 9/1993 | Sakakima et al. | 338/32 R |

FOREIGN PATENT DOCUMENTS 0406060 1/1991 European Pat. Off.
2-23681 1/1990 Japan.

*Primary Examiner*—Marvin M. Lateef
*Attorney, Agent, or Firm*—Wenderoth, Lind & Ponack

[57] ABSTRACT

A magnetoresistance effect element including a substrate and at least two magnetic thin layers which are laminated with interposing a non-magnetic thin layer therebetween on said substrate, wherein adjacent magnetic thin layers through the non-magnetic thin layer have different coercive forces and each of the magnetic thin layers and the non-magnetic layer has a thickness of not larger than 200 Å, which has a large magnetoresistance ratio of several % to several ten % at a small external magnetic field of several Oe to several ten Oe and can provide a MR sensor having a high sensitivity and a MR head which achieves high density magnetic recording.

11 Claims, 4 Drawing Sheets

MAGNETORESISTANCE EFFECT ELEMENT

FIELD OF THE INVENTION

The present invention relates to a magnetoresistance effect element for reading a magnetic field intensity as a signal in a magnetic recording medium and the like.

A highly practical magnetoresistance effect element is required to have a large resistance change in a small external magnetic field. The magnetoresistance effect element of the present invention has a large resistance change in a small external magnetic field and can be practically used.

PRIOR ART

In these years, a sensitivity of a magnetic sensor and a density of magnetic recording have been increased. With such increase, a magnetoresistance effect magnetic sensor (hereinafter referred to as "MR sensor") and a magnetoresistance effect magnetic head (hereinafter referred to as "MR head") have been vigorously developed. The MR sensor and head read an external magnetic signal through the resistance change in a reading sensor part comprising a magnetic material. Since a relative speed of the MR sensor or head with a magnetic recording medium does not depend on a reproducing output, a high sensitivity is achieved by the MR sensor and a high output is obtained by the MR head even in case of a high density magnetic recording.

However, with a MR sensor which comprises a conventional magnetic substance utilizing anisotropic magnetoresistance effect such as $Ni_{0.8}Fe_{0.2}$, the resistance change rate $\Delta R/R$ (which will be defined below) is only about 2 to 5%. Then, a MR element having a larger resistance change rate is desired.

Recently, it was found that an artificial superlattice film in which directions of magnetization in adjacent magnetic layers are opposite such as $[Fe/Cr]_N$ induces a large magnetoresistance effect (Phys. Rev. Lett., 61, 2472 (1988)). However, with this artificial superlattice film, an external magnetic field at which the maximum resistance change is achieved is very large, namely from ten several KOe to several ten KOe. Therefore, this artificial lattice film as such cannot be practically used.

That is, the conventional MR sensor and head have a small resistance change, and the conventional artificial superlattices such as Fe/Cr require too large external magnetic field to induce the resistance change.

SUMMARY OF THE INVENTION

As a result of extensive study to solve the above problems, the present inventors have succeeded in producing a highly practical magnetoresistance effect element.

The present invention provides a magnetoresistance effect element comprising a substrate and at least two magnetic thin layers which are laminated with interposing a non-magnetic thin layer therebetween on said substrate, wherein adjacent magnetic thin layers through the non-magnetic thin layer have different coercive forces and each of the magnetic thin layers and the non-magnetic layer has a thickness of not larger than 200 Å.

DETAILED DESCRIPTION OF THE INVENTION

Figure 2:
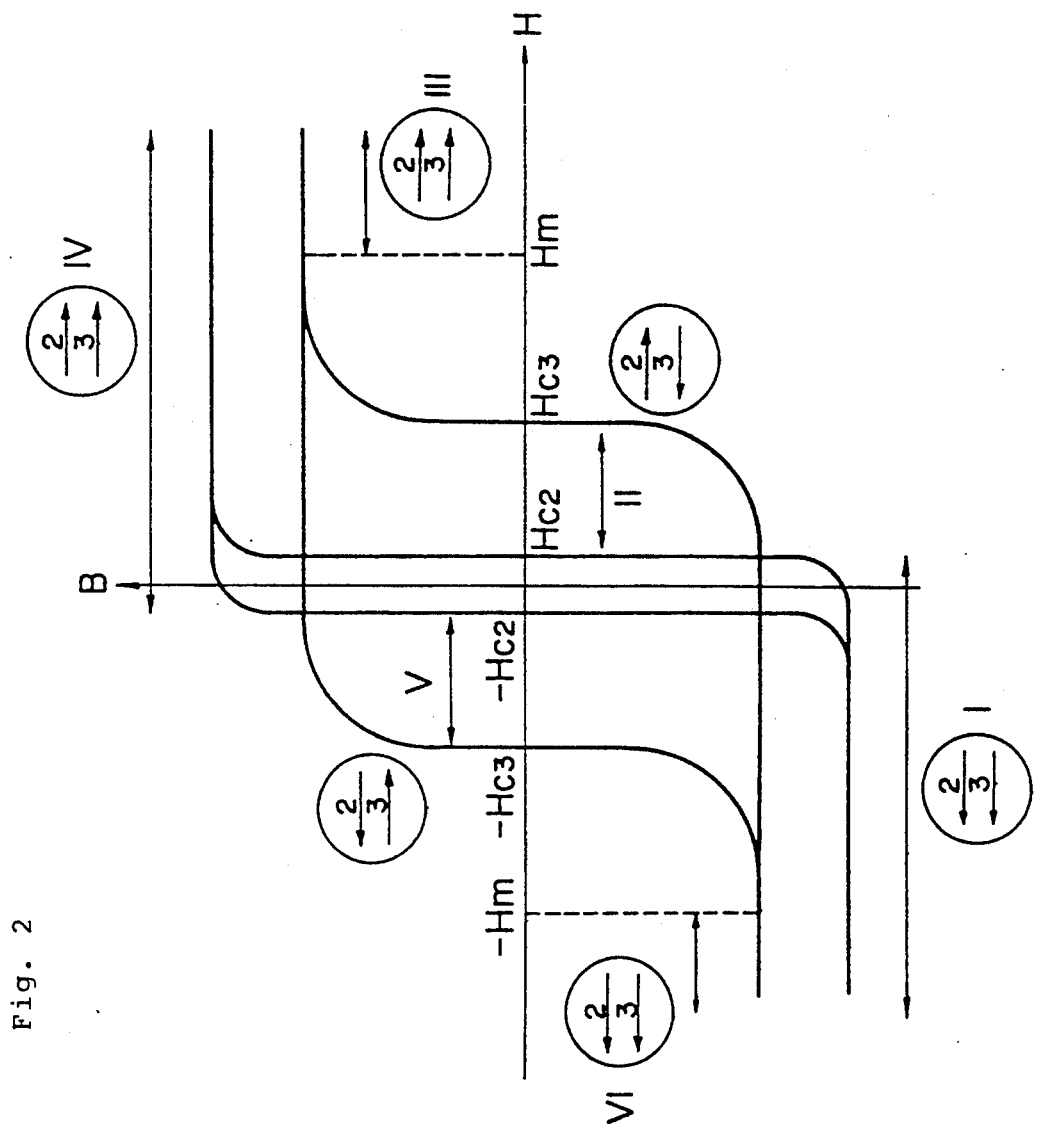
FIG. 2 is a schematic B-H curve which illustrates a function of the present invention.

In the magnetoresistance effect element of the present invention, it is essential that the adjacent magnetic thin layers through the non-magnetic thin layer have different coercive forces, because the principle of the present invention is based on the fact that, when the directions of the magnetization in the adjacent magnetic layers are different, conduction electrons are scattered depending on spins so that the resistance increases, and when the directions of the magnetization are opposite, the element has the largest resistance. That is, in the present invention, as shown in FIG. 2, when an external field is between a coercoercive force $Hc_2$ of one magnetic thin layer and a coercive force $Hc_3$ of another magnetic thin layer ($Hc_2 < H < Hc_3$), the directions of the magnetization in the adjacent magnetic layers are opposite so that the resistance increases. The relationship among the external magnetic field, the coercive force and the directions of the magnetization will be explained in detail later.

A kind of the magnetic substance to be used as the magnetic thin layer according to the present invention is not limited. Preferred examples are Fe, Ni, Co, Mn, Cr, Dy, Er, Nd, Tb, Tm, Ce and Gd. As alloys or compounds comprising such element, Fe-Si, Fe-Ni, Fe-Co, Fe-Gd, Fe-Al-Si (Sendust, etc.), Fe-Y, Fe-Mn, Cr-Sb, Co base amorphous alloys, Co-Pt, Fe-Al, Fe-C, Mn-Sb, Ni-Mn, Co-O, Ni-O, Fe-O, Ni-F, ferrites and the like are preferred.

In the present invention, two or more magnetic substances having different coercive forces are selected from the above substances to form the magnetic thin layers.

The upper limit of each magnetic thin layer is 200 Å, while the lower limit of the layer thickness is not specifically limited. However, when the layer thickness is less than 4 Å, a Curie temperature is lower than room temperature so that the element cannot be practically used. When the layer thickness is 4 Å or larger, the layer thickness can be easily made uniform, a layer quality is improved and saturation magnetization is not excessively decreased. Though the effect is not deteriorated when the layer thickness is larger than 200 Å, it is not increased as the layer thickness increases, and the production of such thick layer is wasteful and uneconomical.

The coercive force of each magnetic layer varies with the strength of the external magnetic field applied to the element or the required resistance change rate and is selected from the range between about 0.001 Oe and about 10 kOe. A ratio of the coercive forces of the adjacent magnetic layers is from 1.2:1 to 100:1, preferably from 5:1 to 50:1, more preferably from 8:1 to 20:1.

Since the magnetic characteristics of each magnetic thin layer present in the magnetoresistance effect element cannot be directly measured, in general, they are measured as follows:

The magnetic thin layers to be measured are vapor deposited alternately with the non-magnetic thin layers till the total thickness reaches about 200 to 400 Å to produce a sample for measurement, and its magnetic characteristics are measured. In this case, the thickness of each magnetic thin layer, the thickness of each non-magnetic layer and the composition of the non-magnetic layer are the same as those in the magnetoresistance effect element.

The magnetic characteristics of the magnetic thin layer other than the coercive force are not critical. A squareness ratio of the magnetic thin layer having a small coercive force is preferably from 0.9 to 1.0.

The non-magnetic layer acts as a material for decreasing a magnetic interaction between the magnetic thin layers having the different coercive forces and its kind is not limited. The non-magnetic material can be selected from various metallic or semimetallic non-magnetic materials or non-metallic non-magnetic materials.

Preferred examples of the metallic non-magnetic material are Au, Ag, Cu, Pt, Al, Mg, Mo, Zn, Nb, Ta, V, Hf, Sb, Zr, Ga, Ti, Sn, Pb or their alloys. Preferred examples of the semimetallic non-magnetic material are Si, Ge, C, B and a composite material of at least one of these element and other element. Preferred examples of the non-metallic non-magnetic material are $SiO_2$, SiO, SiN, $Al_2O_3$, ZnO, MgO, TiN or a composite material of at least one of these materials and other element.

A thickness of the non-magnetic thin layer is not larger than 200 Å. When this thickness exceeds 200 Å, the strength of the resistance is determined by the non-magnetic layer(s), so that the scattering effect depending on the spins is relatively reduced and then the magnetoresistance change rate is decreased. When this thickness is smaller than 4 Å, the magnetic interaction between the magnetic thin layers becomes too large so that it is difficult to differentiate the directions of the magnetization of the magnetic thin layers.

The thickness of each of the magnetic and non-magnetic thin layers can be measured by a transmittance electron microscope, a scanning electron microscope, Auger electron spectroscopy and the like. A crystal structure of the thin layer can be identified by X-ray diffraction, reflection high-energy electron diffraction (RHEED) and the like.

In the magnetoresistance effect element according to the present invention, the number of the laminated artificial superlattice layers N is not critical, and is determined according to the desired magnetoresistance change and the like. To obtain a sufficient magnetoresistance change, N is preferably at least 3. As the number of the laminated layers increases, the resistance change rate increases though the productivity decreases. When N is too large, the resistance of the whole element excessively decreases so that the practical use of the element may be difficult. In general, N is 50 or less.

In the above explanation, two magnetic thin layers having different coercive forces are used. It is possible to use three or more magnetic thin layers having different coercive forces, whereby two or more external magnetic fields at which the directions of the magnetization are inverted can be set, so that a range of acting magnetic field strength can be increased.

On the surface of the uppermost magnetic thin layer, an oxidation-inhibiting film made of, for example, silicon nitride or silicon oxide may be provided, or a metallic conductive film for the formation of an electrode may be provided.

The thin layer may be formed by vapor deposition, sputtering, molecular beam epitaxy (MBE) and the like. As the substrate, glass, silicon, MgO, GaAs, ferrite, CaTiO and the like can be used.

Now, the relationship among the external magnetic field, the coercive force and the directions of the magnetization is explained.

For simplicity, the explanation will be made by making reference to an element containing two magnetic thin layers (2) and (3) having different coercive forces.

As shown in FIG. 2, the coercive forces Hc of two magnetic layers are $Hc_2$ and $Hc_3$ ($0<Hc_2<Hc_3$). First, the external magnetic field H is applied so that H is smaller than $-Hcm$ (Hcm being an eternal magnetic field at which the magnetization of the magnetic thin layer (3) is saturated). The directions of the magnetization of the magnetic thin layers (2) and (3) are in the same negative ($-$) direction as that of H. As the external magnetic field is increased, in the region I wherein $H<Hc_2$, the directions of the magnetizations of the both magnetic thin layers are still in the negative direction.

The external magnetic field is increased to the region II wherein $Hc_2<H<Hc_3$, the direction of the magnetization of the magnetic thin layer (2) is inverted so that the directions of the magnetization of the magnetic thin layers (2) and (3) are opposite. When the external magnetic field is further increased to the region III wherein $Hcm<H$, the directions of the magnetization of the magnetic thin layers (2) and (3) are both in the positive ($+$) direction.

Thereafter, when the external magnetic field H is decreased, in the region IV wherein $-Hc_2<H$, the directions of the magnetization of the both magnetic thin layers (2) and (3) are still in the positive direction, but in the region V wherein $-Hc_3<H<-Hc_2$, the direction of the magnetization of the magnetic thin layer (2) is inverted to the negative direction so that the directions of the magnetization of the magnetic thin layers (2) and (3) are opposite. Further, in the region VI wherein $H<-Hcm$, the directions of the magnetization of the magnetic thin layers (2) and (3) are both in the negative direction. In the regions II and V wherein the directions of the magnetization of the magnetic thin layers (2) and (3) are opposite, the conduction electrons are scattered depending on the spins so that the resistance increases.

For example, when $Ni_{0.8}Fe_{0.2}$ having a small Hc ($Hc_2$ of about several Oe) is selected as a material for the magnetic thin layer (2) and Co having a slightly larger Hc ($Hc_3$ of several ten Oe) is selected as a material for the magnetic thin layer (3), it is possible to provide a MR element which has the large resistance change at a small external magnetic field around the external magnetic field $Hc_2$.

EXAMPLES

The magnetoresistance effect element of the present invention will be illustrated by making reference to the accompanying drawing.

Figure 1:
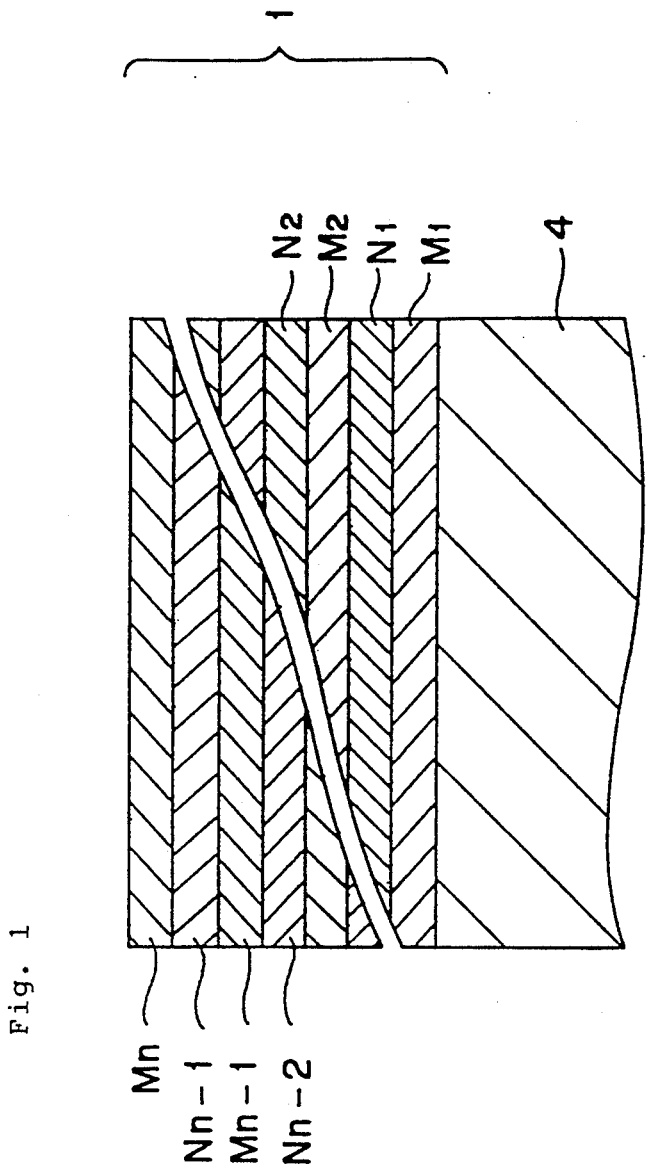
FIG. 1 is a partly omitted cross section of a magnetoresistance effect element according to the present invention.

FIG. 1 is a cross section of an example of the artificial superlattice film 1 of the present invention. In FIG. 1, the artificial lattice film 1 has magnetic thin layers $M_1$, $M_2, \ldots, M_{n-1}$ and $M_n$ on a substrate 4 and, between adjacent two magnetic layers, non-magnetic thin layers $N_1, N_2, \ldots, N_{n-2}$ and $N_{n-1}$.

The present invention will be explained by the experimental results.

Example 1

A glass plate 4 as a substrate was placed in a high vacuum deposition apparatus and the apparatus was evacuated to $10^{-9}$-$10^{-10}$ Torr. While rotating the substrate which was kept at room temperature, an artificial lattice film 1 having the following composition was formed. While applying a magnetic field in an area of the substrate, the film was grown at a rate of about 0.3 Å/sec.

The compositions and the magnetoresistance change rates of the multilayer films consisting of the magnetic thin layers and the non-magnetic thin layers are shown in Table 1. In Table 1, when the composition is expressed, for example, as $[Ni_{0.8}Fe_{0.2}(30)/Cu(20)/Co(30)/Cu(20)]_5$, it means that a thin layer of an alloy of 80% Ni and 20% Fe having a thickness of 30 Å, a Cu thin layer having a thickness of 20 Å, a Co thin layer having a thickness of 30 Å and a Cu thin layer having a thickness of 20 Å were successively deposited and the deposition of these layers was repeated five times.

The magnetization was measured by a vibrating sample magnetometer. The dimension of the sample for MR measurement, which had the composition shown in Table 1, was 0.3×10 mm. While applying the external magnetic field in an in-plane direction perpendicular to a direction of an electric current, the resistance was measured by a four prove method by changing the external field from −50 Oe to +5000 Oe, and the magnetoresistance ratio ΔR/R was calculated from the measured resistances. The magnetoresistance ratio ΔR/R was calculated according to the following equation:

$$\frac{\Delta R}{R} = \frac{R_{max} - R_{min}}{R_{min}} \times 100 \, (\%)$$

wherein Rmax is the maximum resistance and Rmin is the minimum resistance.

TABLE 1

| Composition of artificial superlattice film | ΔR/R |
|---|---|
| $[Ni_{0.8}Fe_{0.2}(25)/Cu(55)/Co(25)/Cu(55)]_1$ | 1.2 |
| $[Ni_{0.8}Fe_{0.2}(25)/Cu(55)/Co(25)/Cu(55)]_2$ | 2.9 |
| $[Ni_{0.8}Fe_{0.2}(25)/Cu(55)/Co(25)/Cu(55)]_3$ | 4.1 |
| $[Ni_{0.8}Fe_{0.2}(25)/Cu(55)/Co(25)/Cu(55)]_5$ | 5.5 |
| $[Ni_{0.8}Fe_{0.2}(25)/Cu(55)/Co(25)/Cu(55)]_7$ | 6.1 |
| $[Ni_{0.8}Fe_{0.2}(25)/Cu(55)/Co(25)/Cu(55)]_{10}$ | 7.5 |
| $[Ni_{0.8}Fe_{0.2}(25)/Cu(55)/Co(25)/Cu(55)]_{15}$ | 8.8 |
| $[Ni_{0.8}Fe_{0.15}Mo_{0.05}(25)/Cu(55)/Co(25)/Cu(55)]_5$ | 5.0 |
| $[Ni_{0.8}Fe_{0.2}(25)/Pt(50)/Co(25)/Pt(50)]_5$ | 3.0 |
| $[Ni_{0.8}Fe_{0.2}(25)/Al(4)/Co(25)/Al(4)]_{15}$ | 3.0 |
| $[Ni_{0.8}Fe_{0.2}(25)/Ti(4)/Co(25)/Ti(4)]_{15}$ | 4.0 |

Figure 3:
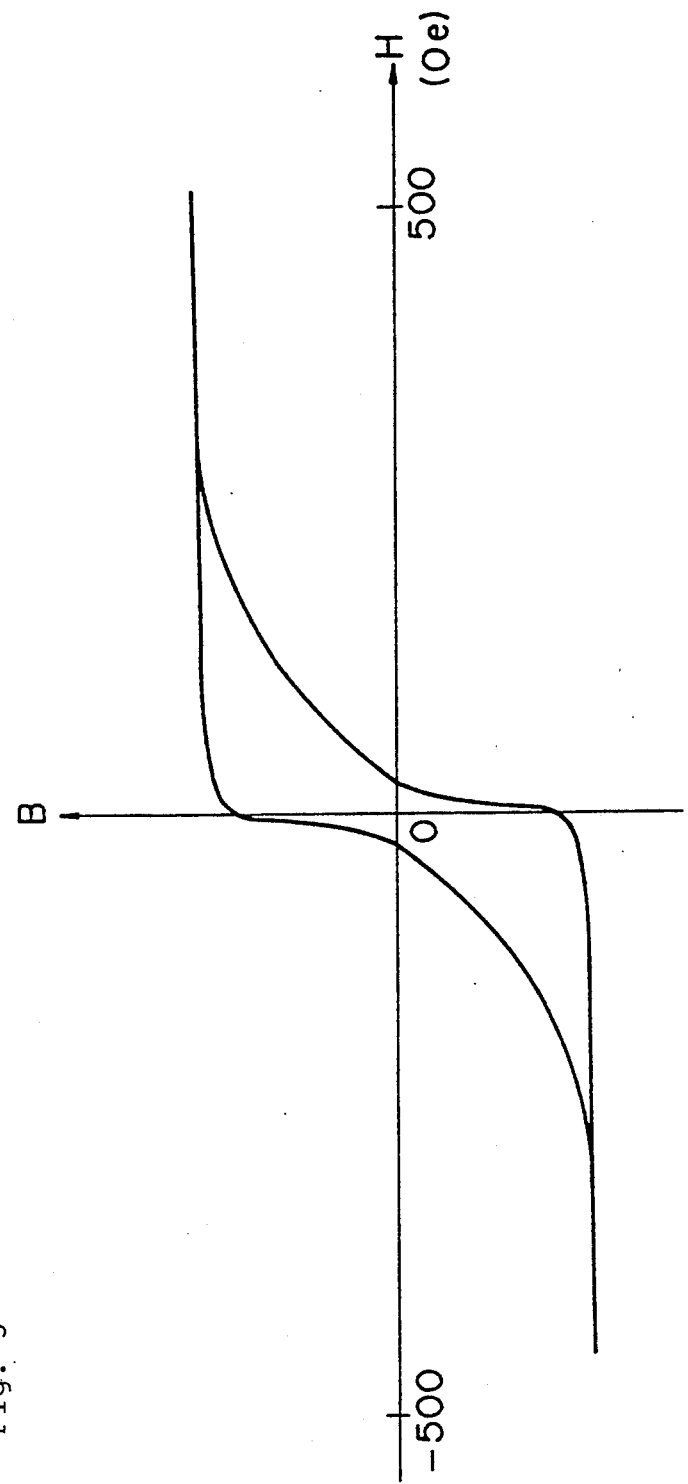
FIG. 3 is B-H curve of $[NiFe(25)/Cu(55)/Co(25)/Cu(55)]_5$.
Figure 4:
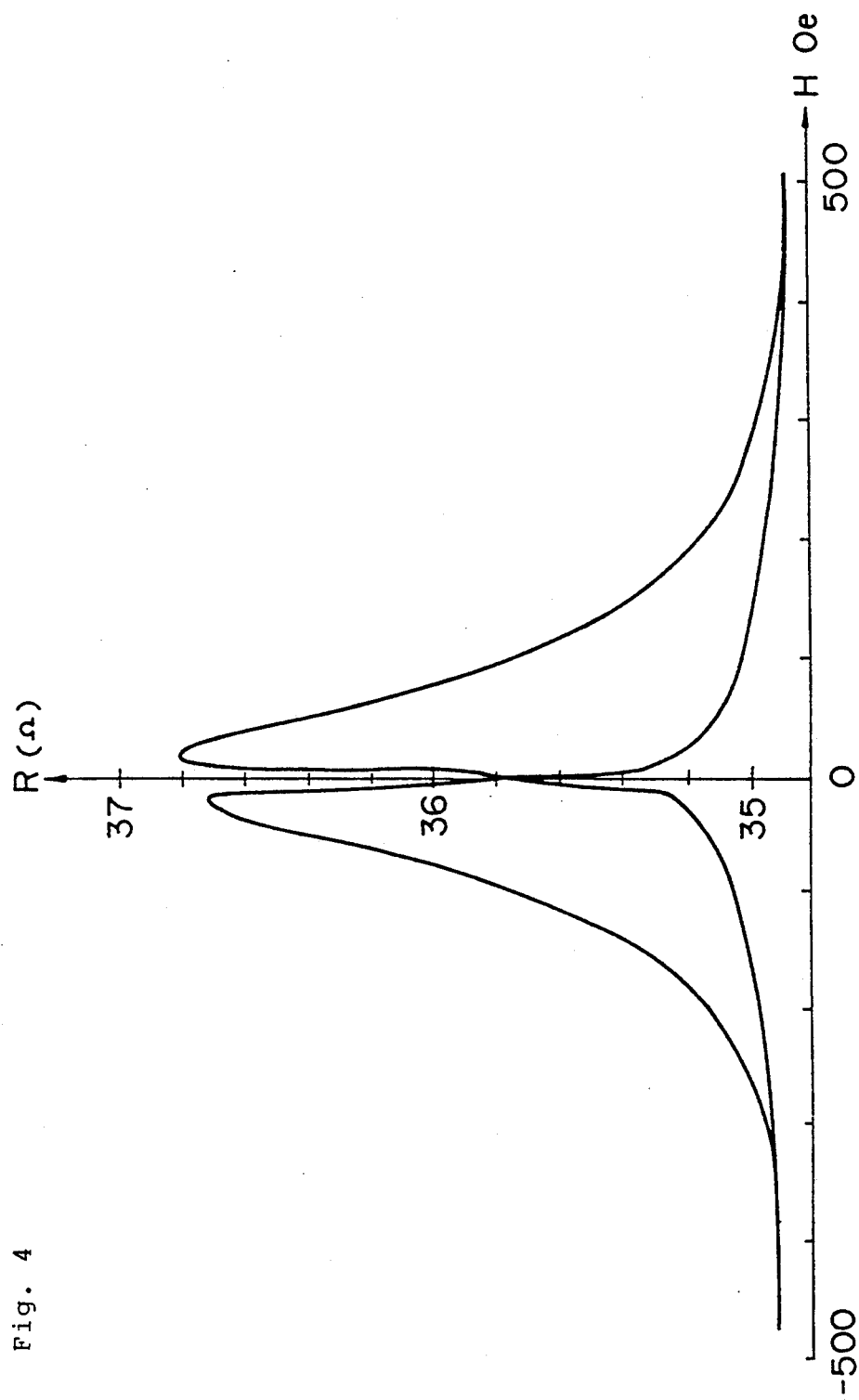
FIG. 4 is a graph showing a relationship between the external magnetic field H and the resistance R of $[NiFe(25)/Cu(55)/Co(25)/Cu(55)]_5$.

FIGS. 3 and 4 show the B-H curve and the external magnetic field-resistance curve of $[Ni_{0.8}Fe_{0.2}(25)/Cu(55)/Co(25)/Cu(55)]_5$, respectively.

EXAMPLE 2

In the same manner as in Example 1, six magnetoresistance effect elements having the compositions shown in Table 2 were produced.

The resistance change was measured by changing the external magnetic filed from −3000 Oe to +3000 Oe in a direction of an easy axis of magnetization (E. A.) or a hard axis of magnetization (H. A.). The results are shown in Table 2.

Table 2

TABLE 2

| Composition of artificial superlattice film | ΔR/R H//H.A. | ΔR/R H//E.A. |
|---|---|---|
| $[Ni_{0.8}Fe_{0.2}(30)/Cu(20)/Co(30)/Cu(20)]_{15}$ | 1.4 | — |
| $[Ni_{0.8}Fe_{0.2}(30)/Cu(35)/Co(30)/Cu(35)]_{15}$ | 4.4 | — |
| $[Ni_{0.8}Fe_{0.2}(30)/Cu(50)/Co(30)/Cu(50)]_{15}$ | 9.9 | 8.8 |
| $[Ni_{0.8}Fe_{0.2}(30)/Au(20)/Co(30)/Au(20)]_{15}$ | 2.9 | 0.7 |
| $[Ni_{0.8}Fe_{0.2}(30)/Au(35)/Co(30)/Au(35)]_{15}$ | 4.0 | 2.9 |
| $[Ni_{0.8}Fe_{0.2}(30)/Au(50)/Co(30)/Au(50)]_{15}$ | 4.7 | — |

With the compositions of $[Fe(30)/Cu(35)/Co(30)/Cu(35)]_{15}$ and $[Ni(30)/Cu(35)/Co(30)/Cu(35)]_{15}$, substantially the same results as above were obtained.

In addition to above Examples, when experiments were carried out by changing the kinds of the non-magnetic thin layer and layer thicknesses, the shape of the B-H curve of the artificial superlattice films changed gradually and thin the magnetoresistance ratio ΔR/R, the shape of the external magnetic field-resistance curve and the external magnetic field $H_R$ at the maximum resistance Rmax varied.

In the magnetoresistance effect element of the present invention, the extremely high resistance change is achieved by selecting the magnetic characteristics of the magnetic thin layers and the thickness and kind of the non-magnetic thin layer(s). Further, the magnetic field strength at which the resistance is maximum can be relatively freely selected.

EFFECTS OF THE INVENTION

The magnetoresistance effect element of the present invention has a large magnetoresistance ratio of several percentages to several ten percentage at a small external magnetic field of several Oe to several ten Oe. Therefore, the MR sensor having a high sensitivity and the MR head which achieves the high density magnetic recording can be provided.

We claim:

1. A magnetoresistance effect element having a multilayer structure of the following layers:

[(a layer of an alloy comprising Ni and Fe)/(a layer of Cu or its alloy)/
   (a layer of Co or its alloy)/(Cu or its alloy)]$_n$ wherein n is the number of the above multilayer structure and is an integer from 3 to 15, and a thickness of the layer of Cu or its alloy is from 30 to 55 Å.

2. The magnetoresistance effect element according to claim 1 having the composition $[Ni_{0.8}Fe_{0.2}(25)/Cu(55)/Co(25)/Cu(55)]_3$
   $[Ni_{0.8}Fe_{0.2}(25)/Cu(55)/Co(25)/Cu(55)]_5$
   $[Ni_{0.8}Fe_{0.2}(25)/Cu(55)/Co(25)/Cu(55)]_7$
   $[Ni_{0.8}Fe_{0.2}(25)/Cu(55)/Co(25)/Cu(55)]_{10}$
   $[Ni_{0.8}Fe_{0.2}(25)/Cu(55)/Co(25)/Cu(55)]_{15}$ or
   $[Ni_{0.8}Fe_{0.15}Mo_{0.05}(25)/Cu(55)/Co(25)/Cu(55)]_5$,
   the numbers in parentheses representing the thickness in Å of the respective layers.

3. The magnetoresistance effect element according to claim 1, wherein said magnetic thin layer is formed from at least one magnetic substance selected from the group consisting of Fe, Ni, Co, Mn, Cr, Dy, Er, Nd, Tb, Tm, Ce, Gd and their alloys and compounds.

4. The magnetoresistance effect element according to claim 2, wherein said alloy or compound is selected from the group consisting of Fe-Si, Fe-Ni, Fe-Co, Fe-Gd, Fe-Al-Si, Fe-Y, Fe-Mn, Cr-Sb, Co base amorphous alloys, Co-Pt, Fe-Al, Fe-C, Mn-Sb, Ni-Mn, Co-O, Ni-O, Fe-O, Ni-F and ferrites.

5. The magnetoresistance effect element according to claim 1, wherein each of said magnetic thin layers has a thickness of not larger than 200 Å.

6. The magnetoresistance effect element according to claim 4, wherein a thickness of each of said magnetic thin layers is at least 4 Å.

7. The magnetoresistance effect element according to claim 1, wherein said non-magnetic thin layer is formed from at least one metallic non-magnetic material selected from the group consisting of Au, Ag, Cu, Pt, Al, Mg, Mo, Zn, Nb, Ta, V, Hf, Sb, Zr, Ga, Ti, Sn, Pb and their alloys.

8. The magnetoresistance effect element according to claim 1, wherein said non-magnetic thin layer is formed from at least one semimetallic non-magnetic material selected from the group consisting of Si, Ge, C, B and a composite material of at least one of these element and other element.

9. The magnetoresistance effect element according to claim 1, wherein said non-magnetic thin layer is formed from at least one non-metallic non-magnetic material selected from the group consisting of $SiO_2$, SiO, SiN, $Al_2O_3$, ZnO, MgO, TiN and a composite material of at least one of these materials and other element.

10. The magnetoresistance effect element according to claim 1, wherein said non-magnetic thin layer has a thickness of not larger than 200 Å.

11. The magnetoresistance effect element according to claim 9, wherein a thickness of said non-magnetic thin layer is at least 4 Å.

* * * * *